United States Patent [19]

Bauer et al.

[11] Patent Number: 4,704,301
[45] Date of Patent: Nov. 3, 1987

[54] METHOD OF MAKING LOW RESISTANCE CONTACTS

[75] Inventors: Hans J. Bauer; Marianne B. Froehlich, both of Boeblingen, Fed. Rep. of Germany

[73] Assignee: International Business Machines Corporation, Armonk, N.Y.

[21] Appl. No.: 819,771

[22] Filed: Jan. 16, 1986

[30] Foreign Application Priority Data

Jan. 17, 1985 [EP] European Pat. Off. ........ 85100403.6

[51] Int. Cl.$^4$ .............................................. B05D 3/06
[52] U.S. Cl. ................................ 427/38; 204/192.32; 204/298; 427/294; 427/295; 118/50.1
[58] Field of Search ........................ 427/294, 295, 38; 204/192.32, 298

[56] References Cited

U.S. PATENT DOCUMENTS 3,298,863 1/1967 McCusker ............................ 427/93
3,691,053 9/1972 James et al. ........................ 204/298

OTHER PUBLICATIONS

Dushman, *Scientific Foundations of Vacuum Technique*, John Wiley & Sons, New York (1962), pp. 678–683.
"Forming Low Metal-To-Metal Contact Resistance in Multilevel Metallizaton on Integrated Circuit Semiconductor Devices" by W. K. Hildick, IBM-TDB, vol. 19, No. 1, Jun. 1976, p. 20.
"Obtaining an Oxide-Free Interface in Via Connections" by H. J. Bauer, IBM-TDB, vol. 20, No. 2, Jul. 1977, pp. 574–576.

*Primary Examiner*—John H. Newsome
*Attorney, Agent, or Firm*—Steven J. Meyers

[57] ABSTRACT

The invention relates to a method of making low resistance contacts between first and second metallization levels in integrated semiconductor circuits. In accordance with the invention, the semiconductor substrates to be cleaned are arranged on a substrate holder in a vacuum chamber. There, a gas plasma is generated by means of a getter electrode made of a material which has a high affinity for oxygen or oxygen containing compounds. This improves the vacuum by reducing the steam partial pressure. The actual cleaning of the exposed surfaces of the semiconductor substrate is effected subsequently by means of cathode sputtering through applying a radio frequency voltage to the substrate holder. By sputtering material from the surface of the getter electrode prior to cathode sputtering of the semiconductor substrate surface, the time for cleaning the semiconductor substrates can be considerably reduced so that it is also possible to clean substrates with masks of temperature-sensitive photoresists by means of cathode sputtering. The invention also comprises a device for carrying out said method.

30 Claims, 4 Drawing Figures

METHOD OF MAKING LOW RESISTANCE CONTACTS

BACKGROUND

1. Field of Invention

This invention relates to a method of making contacts in integrated circuits. More particularly the invention relates to a method of making low resistance contacts between levels of metallization in integrated semiconductor circuits, where the contact openings and channels are cleaned by means of cathode sputtering. The invention also comprises a device for carrying out said method.

2. Background Art

If aluminum metallization is used in semiconductor technology, making good contact connections from one level of metallization to the next one is a problem because when aluminum or an aluminum alloy with a high oxygen affinity such as aluminum-copper is exposed to air, a strongly adhering, thin oxide skin forms thereon because of the high oxygen affinity of aluminum. In circuits with low circuit density and relatively few but large contact openings this problem is solved in an uncomplicated manner in that prior to the application of the next level of metallization the semiconductor substrates are etched with dilute buffered hydrofluoric acid. As a consequence, a thin, noncontiguous aluminum oxide layer is formed in the contact holes. A heat processing of the thus prepared substrates following metallization at approximately 400° C. causes an aluminum self-diffusion and recrystallization at the original metal to metal interface in the contact openings. In this manner, useful and low resistance contacts are obtained.

It has been suggested (IBM-TDB Vol. 19, No. 1, 1976, p. 20) to provide a zinc coating on the previously precleaned metal surface by the immersion of wafers in a zinc sulfate-hydrofluoric acid. The wafers are then heated to approximately 200° to 250° C. and the respective metal is deposited. Following the metal deposition, the wafers are heated in an inert atmosphere for approximately 30 minutes to approximately 350° C., with the consequence of the out-diffusion of zinc atoms into adjacent metal layers, and therefore of low resistance contacts.

It has also been suggested to use an intermediate layer of titanium between the metallization levels. The titanium film reduces the aluminum oxide in the area of the via hole and thus effects a reduction of the contact resistance between the two conductor planes. The disadvantage of this method is that it is difficult to control, and that the reduction of the contact resistance achieved thereby is insufficient in connection with small via holes ($d < 5$ $\mu$m).

In high density integrated circuits where the diameter of the holes decrease and the number of holes increase drastically, conventional cleaning methods can no longer be used. It has therefore become necessary to find an effective cleaning process for via holes. An in situ cleaning process by means of cathode sputtering was developed (IBM-TDB Vol. 20, No. 2, 1977, pp. 574 to 576). Prior to the evaporation of the second metallization level the surface of the first metallization level is cleaned according to this process by means of cathode sputtering, i.e. by applying a high frequency voltage to the wafer holder in an argon atmosphere at low pressure. The conditions for cathode sputtering were such that approximately 10 nm aluminum or aluminum oxide are removed. With this process, the contact resistance is practically reduced to zero. The effectivity of the method is particularly evident when wafers which had been cleaned in a vacuum system by means of cathode sputtering, and subsequently exposed to air for several minutes prior to the vapor deposition of the next metallization level, are compared with wafers which after cleaning by means of cathode sputtering are applied with a metallization level by vapor deposition without the vacuum having been interrupted. It can be demonstrated that under the former conditions aluminum again oxidizes quickly, forming an oxide barrier with a layer thickness of approximately 1.5 to 2.0 nm. The in situ cleaning process by means of cathode sputtering without an interruption of the vacuum is therefore particularly advantageous for high product yields.

However, this method cannot be effectively applied in processes using masks of temperature-sensitive photoresist materials. The reason for this is the length of time required for effective sputter cleaning. During sputter cleaning, the resist reticulates and partly polymerizes due to the argon ion bombardment and high temperature associated with prolonged bombardment and the resist can no longer be removed from the substrate after this process. Prolonged ion bombardment is required to obtain a clean, oxide-free contact in a via because the level of water vapor in the chamber atmosphere causes reoxidation to occur on the previously cleaned substrate surface, thus requiring repeated sputtering until reoxidation does not occur. For example, bare aluminum contacts which are cleaned react with water vapor, and form an oxide layer on the aluminum. This oxide layer is subsequently removed again in the sputtering process. A clean, oxide-free surface is maintained on the aluminum coated wafer holder and in the via when the sputtering reaches a point in time where all residual water vapor has been consumed in the reaction with the aluminum metal.

Thus, to avoid prolonged ion bombardment, and still obtain a clean, oxide-free metal to metal contact in via connections, a low residual water vapor is required in the vacuum work chamber where the wafers are located. Vacuum conditions in standard high vacuum chambers, (i.e. standard chambers are built with seals and gaskets made of rubber material such as viton), are insufficient to maintain an oxide free contact area after the removal of an oxide layer from a contact by sputter cleaning and before the next layer of metal is deposited by evaporation. Standard high vacuum tooling is required in manufacturing type equipment because the manufacturing chambers must be continually and rapidly accessed to move parts in and out thereof.

Considering the restraint that the chamber be of the standard high vacuum type for manufacturing purposes, the problem is how to eliminate oxygen, and oxygen containing compounds, particularly water vapor in the work chamber, which causes reoxidation after sputter cleaning. A Meissner trap may commonly be used to lower the residual water vapor in a vacuum chamber. However, Meissner traps do not reduce the level of residual water vapor low enough to prevent re-oxidation of the sputter cleaned contacts.

Commercial ion getter pumps are also available to reduce the residual water vapor in vacuum work chambers. There are basically two types of ion getter pumps, one operates by evaporation mechanisms and the other by sputtering. These getter pumps are designed to be attached to a flange or a port in a vacuum work chamber. However, these ion getter pumps require ultra high vacuum work chambers to operate effectively, and are thus not suited for use with standard vacuum chambers as are required for manufacturing. Ultra high vacuum chambers require metal gaskets and fastening means such as large, heavy bolts. Such ultra-high vacuum tooling could not be effectively used in a manufacturing mode wherein substrates are continually entered into and removed from the chamber.

Standard high vacuum tooling, which is compatible with rapid access use as required in the manufacturing mode, is not suited for use with commercial ion getter pumps. One reason for this is that vacuum chambers that are pumped with ion getter pumps must be able to withstand relatively high temperatures to drive residual gases from the chamber walls, e.g. temperatures in the range of 400° C. If the chamber walls were not heated, ion getter pumps would not be very effective because of the high outgassing rate of residual gases from the walls of the chamber into the chamber itself. If the chamber walls were heated, ion time if used with standard high vacuum chamber tooling getting pumps would lose their effectiveness in a short because the high temperatures required to drive the residual gases from the chamber walls would cause the rubber seals to leak. When using an ion getter pump, there is a relatively low pressure conductance between the work chamber and getter pump, (i.e. low pressure conductance exists because of pressure drops in the connections and shielding baffles which keep getter material from getting into the work chamber). Due to this low conductance, the pump is effective in its own chamber, but not very effective in the work chamber where residual water vapor would exist for extended periods causing reoxidation on metal surfaces after cleaning.

An additional problem with using ion getter pumps in conjunction with a work chamber to remove water vapor therefrom is that these pumps are generally not selective in the gases that they remove from the chamber. These pumps remove all species of residual gases in the chamber. The only gases that are of concern for the present application are those containing oxygen, particularly water vapor. Because the commercially available ion gettering equipment pumps all gases, they incorporate means for generation of a magnetic field to enhance pumping action. This makes such equipment bulky and awkward to use and does not allow one to place such pumps in close proximity to the wafers or workpieces inside the vacuum work chamber.

It is therefore a primary object of the invention to provide a method for cleaning semiconductor substrates covered with masks of temperature-sensitive resist materials, by means of a more effective cathode sputtering method wherein shorter sputter clean cycles can be used.

It is another object to provide a method for cleaning semiconductor substrates by cathode sputtering in a manufacturing mode, wherein rapid access is required to a standard high vacuum work chamber, and ultra high vacuum tooling is not required.

It is another object to selectively remove water vapor or other oxygen containing gases from the work chamber, particularly in the area of the chamber in close proximity to the wafers.

It is another object to provide an effective means for carrying out this method and for improving the vacuum conditions in a sputtering deposition chamber.

SUMMARY OF THE INVENTION

The objects of the invention are achieved by a method comprising the following steps:
the semiconductor substrates having exposed via holes and channels between metallization layers are placed in a substrate holder of a vacuum chamber,
the chamber is evacuated and a noble gas is introduced,
a gas plasma is generated by applying a radio frequency voltage or a high negative bias DC voltage to a getter electrode, making the electrode surface negative with respect to the plasma, causing ion bombardment of the electrode surface;
the getter electrode being made of a material having a high affinity for oxygen or oxygen containing compounds such as water vapor;
steam partial pressure in the chamber is reduced and the vacuum improved;
the semiconductor substrates are subsequently cleaned by means of cathode sputtering in the area of the via holes and channels by applying a high frequency voltage to the substrates.

The invention also comprises a device for carrying out the above method. The device comprises a vacuum chamber, substrate holder, getter electrodes and a high frequency voltage source which supplies high frequency voltage to the substrates causing cathode sputtering in the gas plasma atmosphere created by the electrodes.

BRIEF DESCRIPTION OF THE DRAWINGS

The invention will be specified in detail with reference to the specific description and FIGS. 1 to 4.

DESCRIPTION OF THE PREFERRED EMBODIMENT

A contact hole within a semiconductor device is a small opening provided in an insulating layer and filled with metal. The function of contact holes is to interconnect electric conductors above and beneath the insulating layer.

Figure 1:
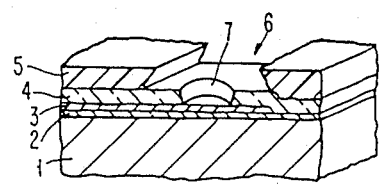
FIG. 1 is a perspective view of a semiconductor substrate with a channel and a via hole to be cleaned.

FIG. 1 depicts a typical semiconductor substrate 1 with an irregular surface topology. An insulating layer 2 is arranged on the surface of the semiconductor substrate 1. Deposited on insulating layer 2 is a metal layer 3 whose surface is in turn covered by an insulating layer 4. A photoresist layer 5 is used to develop photoresist patterns in a known manner. As shown in FIG. 1, a contact opening 7 was made in insulating layer 4. For depositing a second metallization level (not shown) a channel 6 was made in photoresist layer 5. Prior to the application of the second metallization level the surface of insulating layer 4 has to be cleaned in the area of channel 6, and the surface of metal layer 3 in the area of contact opening 7.

Figure 3:
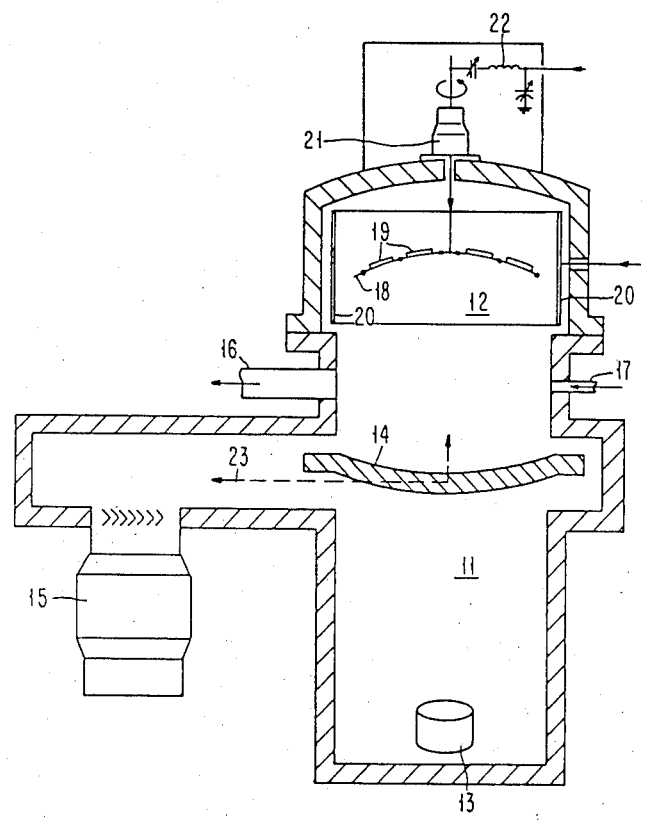
FIG. 3 is a device for carrying out the method as disclosed by the invention.

A cleaning device which uses the basic ideas of the invention and which also facilitates the vapor deposition of the second metallization level is schematically depicted in FIG. 3. It comprises a cathode sputtering system for the in situ surface cleaning, particularly of semiconductor surfaces with channels and contact openings. In the same device, a metal, e.g. aluminum or aluminum copper can be vapor-deposited, with an increased vacuum being maintained. Details of how the increased vacuum is achieved are discussed hereinafter. In preferred form, a vacuum chamber 12 and an evaporation chamber 11 with a source 13 are the separate units provided. A separating valve 14 is arranged between both chambers which permits the separating of vacuum chamber 12 from evaporation chamber 11. Via a diffusion pump 15 the vacuum required during evaporation is generated and maintained in chambers 11, 12, whereas via an additional diffusion pump (not shown) which is connected via line 16 to vacuum chamber 12 the vacuum required during cleaning by means of cathode sputtering is generated in the vacuum chamber. For transporting a gas into this chamber, e.g. argon, an inlet 17 is provided. An electrically insulated substrate holder 18 is rotatably arranged in chamber 12 to hold the silicon wafers 19. Via a rotatably supported radio frequency voltage conduit 21 a motor effects the rotation of substrate holder 18. Radio frequency voltage conduit 21 is also used for applying a radio frequency potential produced by a generator to the substrates, i.e. through substrate holder 18 via a matching network 22.

For carrying out the method, chamber 12, for cleaning semiconductor surfaces by means of cathode sputtering, is additionally equipped with a getter electrode 20 made of aluminum, titanium or other material having a high affinity for oxygen or an oxygen containing compound being electrically insulated against the chamber wall as depicted in FIG. 3. The getter electrode 20 is connected to an alternating voltage source via a network or, if direct voltage is applied, directly to a direct voltage source. A negative voltage must be maintained on the surface of the electrode to effect the bombardment of its surface with argon ions, causing sputtering.

The shape of getter electrode 20 is of any suitable shape having a large surface area and no interfering with other physical parts of the device. One example is an annular cylinder.

Figure 4:
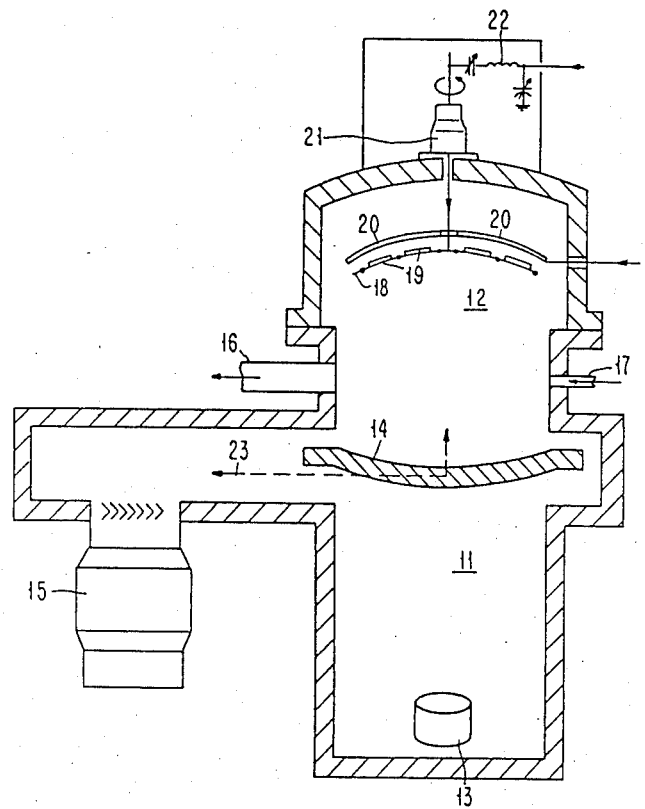
FIG. 4 is another device to carry out the method as disclosed by the invention.

FIG. 4 shows another arrangement of the getter electrode 20, where it takes the form of a spherical segment which is in conformity with substrate holder 18. Like the getter electrode 20 in FIG. 3, the spherical segment is made of aluminum or other metal having a high affinity to oxygen such as titanium, and electrically insulated against the chamber wall. The electric connection of the spherical segment to a voltage source corresponds to that of the getter electrode 20 in FIG. 3.

As specified as an object of the invention, semiconductor substrates with photoresist masks can be cleaned in situ by means of cathode sputtering, particularly with masks of temperature-sensitive resist materials, e.g. wafers with masks of a modified resist on the basis of novolac and quinone diazide, or with electron beam resist masks, e.g. of polymethyl-methacrylate or methyl methacrylate methacrylic acid anhydride copolymer. The method as disclosed by the invention and the device are quite generally suitable for a gentle cleaning of semiconductor substrates with photoresist masks.

In a specific embodiment, the cleaning of a semiconductor substrate with a photoresist mask with negative slope angles (5 in FIG. 1) will be described. Photoresist masks with negative slope angles are particularly advantageous for making metallization patterns following the frequently applied so-called lift-off process where, first, a photoresist mask with such negative slope angles is generated on the substrate, and then metal is vapor-deposited in blanket fashion. Subsequently, the metal on the photoresist mask is lifted off together with said mask, leaving the respective metallization pattern on the substrate. In the lift-off process, the negative slope angles of the photoresist mask provide a precisely defined separating line, with a peeling-off of the metallization pattern from the substrate being avoided.

Figure 2:
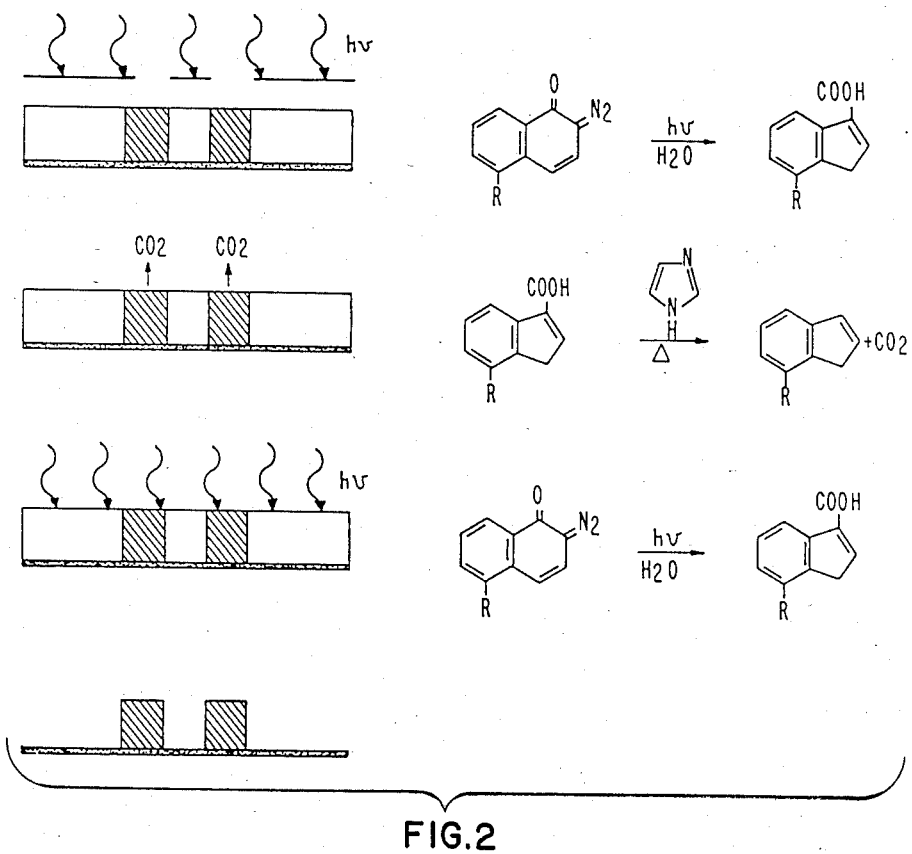
FIG. 2 is a schematic representation of a photoresist process for making a lift-off mask for structurizing a metallization level.

For making resist structures with negative slope angles the mask reversal process schematically depicted in FIG. 2 can be used which will be briefly explained below. To the positive resist on the basis of novolac resin and quinone diazide, as used in this process, a small quantity of a basic additive as imidazole, 1-hydroxyethyl-2-alkylimidazoline or triethanolamine is admixed. In the reversal process, the thus modified resist is exposed through a mask, cured by heating after exposure, blanket exposed and finally developed in a dilute aqueous alkaline solution, with a negative image of the mask with negative slope angles and of high quality being obtained. If the resist is exposed with UV light only, and developed in an aqueous alkaline solution a positive image of the mask is the result. The sequence of the mask reversal process is represented in formulas on the right-hand side of FIG. 2. There is however the disadvantage that lift-off structures of the modified photoresist begin to flow at approximately 115° C. For that reason, in situ cleaning processes by means of cathode sputtering could up to now not be used for wafers with masks of the above described resist, because if the contact openings are cleaned by means of cathode sputtering for a minimum of $3\frac{1}{2}$ minutes, the temperatures on the wafer surface reach up to 180° C., and the masks flow together.

During the cleaning process, the wafers 19 to be cleaned (FIG. 3) are placed into the substrate holder 18. After the evacuation of chamber 12 down to a pressure in the high vacuum range of $<1.33\times10^{-6}$ millibar, and the filling-in of argon gas through inlet 17 up to a pressure of approximately $1.33\times10^{-4}$ to $1.33\times10^{-1}$ millibar and particularly advantageously $1.33\times10^{-3}$ to $1.33\times10^{-2}$ millibar, a voltage (e.g. approximately 600 volts) is applied first to an aluminium getter electrode 20, and a gas plasma is generated. Owing to the gas plasma, aluminum is removed from the getter electrode, and thus the oxygen and steam partial pressure in chamber 2 is reduced by chemisorption, and the vacuum in the chamber is increased. Depending upon the evaporator dimensions, after approximately 2 minutes to 20 minutes, and particularly advantageously approximately 5 to 10 minutes, the voltage is switched off the aluminum getter electrode, and the radio frequency voltage at substrate holder 18 is switched on. Processing is effected with an energy density of approximately 0.1 to 1 watt/cm$^2$ particularly advantageously 0.2 to 0.3 watt/cm$^2$, for a period of approximately $\frac{1}{2}$ to approximately 5 minutes particularly advantageously from $\frac{1}{2}$ to 1 minute.

During that time, the surface of insulating layer 4 within the area of channel 6, and the surface of metal layer 3 in the area of the contact opening 7 (FIG. 1) are cleaned by cathode sputtering, i.e. aluminum oxide is removed from the surface of the first metallization consisting of aluminum or aluminum copper, in the area of the contact openings. Subsequent to cathode sputtering, the argon gas is pumped off, separating valve 14 is moved in arrow direction 23 to join the two chambers 11 and 12, and the vapor deposition of the second aluminum or aluminum copper level, respectively, is started without any interruption of the vacuum. Due to the above described cleaning by means of cathode sputtering, the resistance between the first and second metallization levels is reduced to the resistance of the conductors, i.e. the resistance at the interface of the two metals in the contact hole area practically equals zero.

It has been found that the glow discharge generated at the getter electrode prior to the cleaning of the wafers by means of cathode sputtering modifies the residual gas spectrum in the argon plasma in a manner otherwise impossible with methods used in high vacuum technology. Tests with a Meissner trap or a cryopump did not effect the desired vacuum improvement. Sheet steel as an electrode material did not have the effect required for the gettering of residual gas, either. In all those cases the contacts had been highly ohmic contacts. It has been found that using a gettering material having a high affinity for oxygen containing compounds such as water vapor, i.e. aluminum or titanium as a getter electrode material is of particular importance in the in situ cleaning of aluminum or aluminum copper contacts by means of cathode sputtering.

Compared with the prior art, the method disclosed by this invention generates a plasma in the chamber; and as a radio frequency voltage is applied to the getter electrode, the steam partial pressure in the chamber is reduced, which consequently increases the vacuum in the chamber. Subsequently, a radio frequency voltage is applied to the substrates, causing cleaning of the substrates by cathode sputtering. By sputtering material from the surface of an electrode which is reactive with oxygen or oxygen compounds such as water vapor prior to the sputter cleaning of the substrates, the time for the actual in situ cleaning by means of cathode sputtering can be considerably reduced so that structures with masks of temperature-sensitive resist materials can be advantageously cleaned with the above described process.

What is claimed is:

1. A method of forming contaminant free surfaces on metallized areas of a substrate comprising the steps of:
    placing one or more substrates having exposed metallized areas and photoresist thereon into a high vacuum manufacturing chamber having resilient seals and a getter electrode having a high affinity for oxygen mounted therein;
    positioning said substrates so that they are in close proximity to said getter electrode but electrically isolated therefrom and so that the exposed areas of said metallized areas of said substrates are substantially surrounded by a surface of said electrode;
    evacuating said high vacuum manufacturing chamber,
    introducing a noble gas into said high vacuum manufacturing chamber,
    producing a gas plasma at said getter electrode, reducing the partial pressures of oxygen containing gases in said high vacuum manufacturing chamber;
    subsequently and independently to producing said gas plasma, applying a radio frequency voltage to said substrates,
    causing cathode sputtering of said substrates, thereby cleaning exposed surfaces on metallized areas of said substrates.

2. The method of claim 1 wherein said vacuum chamber is evacuated down to a pressure of less than approximately $1.33 \times 10^{-6}$ milliber and said noble gas is introduced at a pressure in the range of approximately $1.33 \times 10^{-4}$ to $1.33 \times 10^{-1}$ millibar.

3. The method of claim 1 wherein a direct voltage is applied to the getter electrode to create a gas plasma.

4. The method of claim 1 wherein a radio frequency voltage is applied to the getter electrode to create a gas plasma.

5. The method of claim 1, 2, 3 or 4 wherein the gas plasma is generated for a period of approximately 7 to 20 minutes.

6. The method of claim 5 wherein said high frequency voltage is applied to said substrates for a period of approximately 0.5 to 5 minutes.

7. The method of claim 6 wherein the energy density implemented during said cathode sputtering is in the range of approximately 0.1 to 1 watts/cm$^2$.

8. The method of claim 1, 2 or 3 further comprising the step of vapor depositing the next metallization level subsequent to said cleaning step while said vacuum chamber is still evacuated.

9. The method of claim 6 further comprising the step of vapor depositing the next metallization level subsequent to said cleaning step while said vacuum chamber is still evacuated.

10. A sputter cleaning apparatus for forming contaminate free surface on metallized areas of a substrate comprising:
    a high vacuum manufacturing chamber having resilient seals and means for evacuating said chamber;
    a substrate holder for receiving and holding substrates, said substrate holder being suitably connected to the inside of said chamber;
    a getter electrode and means for applying a voltage thereto for generating a gas plasma, said getter electrode having a high affinity for oxygen and being suitably arranged on the inside of said high vacuum manufacturing chamber so that the exposed areas of said metallized areas of said substrates are substantially surrounded by a surface of said getter electrode;
    said substrate holder and said getter electrode being electrically isolated from each other
    means for applying a radio frequency voltage to said substrates independently of said means to apply a voltage to said getter electrode, said radio frequency voltage causing cathode sputtering of said metallized areas of said substrates.

11. The apparatus of claim 10 wherein said substrate holder is rotatably mounted to the top of said chamber.

12. The device of claim 11 wherein said substrate holder is electrically insulated and also serves as said means for applying a radio frequency voltage to said substrates.

13. The apparatus of claim 12 wherein each getter electrode is mounted to one of the walls of said chamber.

14. The apparatus of claim 13 wherein each getter electrode is electrically insulated.

15. The apparatus of claim 12 wherein each getter electrode is made of a gettering material having a high affinity for oxygen.

16. The apparatus of claim 15 wherein each getter electrode is made of aluminum.

17. The apparatus of claim 15 wherein each getter electrode is made of titanium.

18. The apparatus of claim 15 wherein each getter electrode is electrically insulated against said chamber walls.

19. The apparatus of claim 15 wherein said getter electrode is a spherical segment which conforms in shape with said substrate holder.

20. The apparatus of claim 18 or 19 wherein said chamber further comprises an inlet means through which a noble gas may be introduced.

21. The apparatus of claim 20 wherein said means for applying a radio frequency voltage is a radio frequency voltage conduit which is suitably attached to said substrate holder.

22. The apparatus of claim 21 further comprising an evaporation chamber.

23. The apparatus of claim 22 further comprising a separation valve separating said vacuum chamber from said evaporation chamber.

24. The apparatus of claim 23 further comprising a diffusion pump for creating and maintaining a vacuum in the chambers when necessary.

25. A sputter cleaning apparatus for forming contaminant free surfaces on metallized areas of a substrate comprising:
   a dual purpose chamber having a high vacuum manufacturing chamber portion having resilient seals and an evaporation chamber portion, said vacuum portion and said evaporation portion being separated by a separation valve;
   inlet and outlet ports in said high vacuum manufacturing chamber portion having resilient seals, of facilitating the introduction and evacuation of gases to and from said chamber;
   a diffusion pump being suitably connected to said outlet ports for creating and maintaining a vacuum when necessary;
   an electrically insulated substrate holder for receiving and holding substrates, said substrate holder being rotatably arranged in said chamber and being rotatably supported by a motor via a radio frequency voltage conduit;
   at least one getter electrode and means for applying a voltage thereto for generating a gas plasma, said electrode being made of a gettering material having a high affinity for oxygen;
   each electrode being electrically insulated against said chamber walls and said substrate holder and being arranged so that the exposed areas of said metallized areas of said substrates are substantially surrounded by a surface of said getter electrode;
   said radio frequency voltage conduit applying a radio frequency voltage to said substrate holder independently of said means to apply a voltage to said getter electrode;
   causing cathode sputtering.

26. The device of claim 25 wherein each getter electrode is made of aluminum.

27. The device of claim 25 wherein each getter electrode is made of titanium.

28. The device of claim 25 wherein each getter electrode is a spherical segment which conforms in shape with said substrate holder.

29. The method of claim 1 wherein there is more than one getter electrode.

30. The apparatus of claim 10 wherein there is more than one getter electrode.

* * * * *